(12) United States Patent
Collins et al.

(10) Patent No.: US 7,098,128 B2
(45) Date of Patent: Aug. 29, 2006

(54) METHOD FOR FILLING ELECTRICALLY DIFFERENT FEATURES

(75) Inventors: Dale W Collins, Boise, ID (US); Rita J Klein, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/931,822

(22) Filed: Sep. 1, 2004

(65) Prior Publication Data

US 2006/0046453 A1 Mar. 2, 2006

(51) Int. Cl.
*H01L 21/4763* (2006.01)

(52) U.S. Cl. .................... 438/620; 438/621; 438/678

(58) Field of Classification Search ............... 438/620, 438/621, 678
See application file for complete search history.

(56) References Cited

U.S. PATENT DOCUMENTS

| | | | |
|---|---|---|---|
| 5,420,074 A * | 5/1995 | Ohshima .................... 438/620 |
| 5,750,012 A | 5/1998 | Ireland et al. |
| 5,869,392 A * | 2/1999 | Kimura ...................... 438/620 |
| 6,242,808 B1 * | 6/2001 | Shimizu et al. ............. 257/762 |
| 6,245,656 B1 * | 6/2001 | Chen et al. ................. 438/618 |
| 6,518,198 B1 | 2/2003 | Klein |
| 6,589,414 B1 | 7/2003 | Klein |
| 6,610,596 B1 * | 8/2003 | Lee et al. .................... 438/653 |
| 6,693,366 B1 | 2/2004 | Klein |
| 6,723,219 B1 | 4/2004 | Collins |
| 6,774,049 B1 | 8/2004 | Klein |
| 6,821,879 B1 * | 11/2004 | Wong ......................... 438/618 |
| 6,838,370 B1 * | 1/2005 | Niuya et al. ................ 438/623 |
| 6,872,659 B1 * | 3/2005 | Sinha ......................... 438/678 |
| 6,900,128 B1 * | 5/2005 | Sinha ......................... 438/678 |
| 7,005,379 B1 * | 2/2006 | Sinha et al. ................ 438/678 |
| 2001/0013473 A1 | 8/2001 | Taylor |
| 2003/0034251 A1 * | 2/2003 | Chikarmane et al. ....... 205/125 |
| 2003/0052330 A1 | 3/2003 | Klein |
| 2003/0201538 A1 * | 10/2003 | Lee et al. .................... 257/751 |
| 2004/0011653 A1 | 1/2004 | Collins |
| 2004/0033687 A1 * | 2/2004 | Sinha ......................... 438/678 |
| 2004/0038052 A1 | 2/2004 | Collins |
| 2004/0137161 A1 * | 7/2004 | Segawa et al. ........... 427/430.1 |
| 2006/0003583 A1 * | 1/2006 | Sinha et al. ................ 438/678 |

* cited by examiner

*Primary Examiner*—Lynne A. Gurley
(74) *Attorney, Agent, or Firm*—Whyte Hirschboeck Dudek SC

(57) ABSTRACT

Methods of electroless filling electrically different features such as contact openings to form interconnects and conductive contacts, and semiconductor devices, dies, and systems that incorporate the interconnects and contacts are disclosed. The contact openings are electrically shorted together with a selective material, a nucleation layer is selectively deposited onto the area to be plated (e.g., the base of the opening), and a conductive material is electroless plated onto the nucleation layer to fill the opening. The process achieves substantially simultaneous filling of openings having different surface potentials at an about even rate.

58 Claims, 4 Drawing Sheets

METHOD FOR FILLING ELECTRICALLY DIFFERENT FEATURES

FIELD OF THE INVENTION

The invention relates generally to semiconductor processing methods of forming contacts and other features, and more particularly to processes for filling electrically different contacts or other features at an even rate with electroless deposited metals.

BACKGROUND OF THE INVENTION

In the fabrication of semiconductor devices, contact holes and other features that are formed on a substrate are filled with a conductive material to provide contacts and other circuitry. Electroless plating techniques are used to deposit copper, silver, platinum, and other conductive materials to fill openings.

A typical plating process to fill a contact opening involves depositing a seed layer (e.g., copper) onto a barrier layer formed over the substrate within the opening, and plating a layer of metal (e.g., copper) onto the substrate by applying an electrical potential between the seed layer and another electrode in the presence of an electroless solution containing an inorganic metal salt and a reducing agent.

Electroless deposition requires active surfaces that are compatible to nucleation and growth by using a metastable system that will heterogeneously nucleate on these selective areas by allowing the reducing agent and the complexed metal to find a favorable site to react. A problem encountered with electroless deposition methods is that surface potential of the feature heavily impacts the fill or plating rate.

In filling multiple electrically isolated features on a substrate by electroless deposition, the differences in surface potential between features can be problematic. The surface potential of features can differ, for example, based on the structure of the features (e.g., hole, elevated structure, etc.), whether the feature is strapped to an active area or to an inactive area in a substrate (or electrically isolated from the active area), the exposure of the feature to light which can generate a bias across a substrate, among other factors. Such differences in surface potential between features can result in uneven activation and significantly different deposition rates from one feature to the next. In traditional plating, low surface potential areas such as holes do not plate as quickly and may receive little or no plating at all. Often, when holes are present in the article to be plated, an uneven fill is deposited in the hole, which is thicker at the top and bottom of the hole than at the center of the hole. This can lead to defects in the circuits.

Therefore, it would be desirable to provide a process that overcomes such problems.

SUMMARY OF THE INVENTION

The present invention provides methods of filling electrically different features, i.e., features such as contact openings that have different surface potentials, by electroless deposition simultaneously and at an even rate, and devices and systems that incorporate such features.

The invention utilizes a shorting layer laid down to connect the features to be filled. The shorting layer comprises a material that is resistant to nucleation and growth from the electroless solution, while in the areas where plating is desired, a nucleation layer that is receptive to the plating solution is selectively provided in the bottom of the feature to be filled. The interconnecting shorting layer sets up an equipotential between the different features to be filled such that the various features can be filled by a conventional electroless plating process in a bottom up deposition, simultaneously and at the same rate of deposition. Thus, the rate of plating of electrically different features is equalized by the interconnecting shorting layer between each site to be plated, and controlled by traditional factors such as the concentration of the electroless solution, mass transport, etc.

In one aspect, the invention provides a method of filling two or more openings in a substrate to forming conductive contacts such as a contact, via and/or trench interconnect. In one embodiment, the method comprises forming a base layer comprising a first conductive material over a substrate having two or more openings, the base layer connecting at least two of the openings and extending into the openings over the bottom surface and sidewalls of the openings; directionally depositing a nucleation layer comprising a second conductive material in the openings over the base layer on the bottom surface (or base) of the openings; selectively removing the nucleation layer such that the nucleation layer remains over the base layer over the bottom surface of the openings; and electroless depositing a conductive material onto the nucleation layer within the openings to fill the openings. The method is useful for filling the two openings about simultaneously and at about the same rate.

In another embodiment, the method comprises forming a layer of a refractory metal (e.g., tantalum or a graded layer of tantalum nitride to tantalum) over an insulative layer to extend into two or more openings over the base (bottom surface) and sidewalls of the openings and over the insulative layer to connect at least two of the openings; directionally depositing a conductive material (e.g., copper) by physical vapor deposition to form a nucleation layer on the refractory metal layer at the base of the openings, with minimal deposition of the nucleation material onto the sidewalls of the openings; removing the nucleation material from the sidewalls of the opening and over the refractory metal outside the openings such that at least a monolayer of the nucleation layer remains on the refractory metal layer at the base of the openings; and electroless plating a conductive metal (e.g., copper, cobalt, metal alloy, etc.) onto the nucleation layer to bottom up fill the openings.

The method of the invention can be used to fabricate a plurality of electrical contacts or interconnects within openings in a substrate (e.g., dielectric layer), the contacts/interconnects comprising, for example, a conductive refractory metal base layer lining the openings and extending over the substrate to connect the openings, a conductive nucleation layer within the openings overlying the base layer on the base but not the sidewalls of the opening; and an electroless deposited conductive layer over the nucleation layer and filling the opening.

The contacts can be formed as part of a semiconductor device, wafer, and/or semiconductor die. In one embodiment, the semiconductive device, wafer, and/or die comprises at least two conductive contacts within openings in an insulative layer over a substrate, the openings comprising a base or bottom surface and sidewalls, the contacts comprising a refractory metal layer lining the openings and extending over the insulative layer to connect the openings, a non-refractory metal nucleation layer over the refractory metal layer on the bottom surface but not the sidewalls of the openings, and an electroless deposited conductive fill over the nucleation layer and filling the openings. At least one of the contacts can be connected to a conductive component or active area and another of the contacts can be connected to an inactive area. The openings can comprise, for example, a contact, via, trench, etc. In another embodiment, a semiconductive device, wafer, and/or die includes at least two conductive contacts within openings in an insulative layer over a substrate, the openings having a base or bottom surface and sidewalls, and the contacts comprising an electroless deposited conductive fill within the openings, a refractory metal layer lining the opening and extending over the insulative layer to interconnect the openings, and a nucleation layer between the refractory metal layer and the conductive fill at the base of the openings. The device, wafer, and/or die can be at least partially encapsulated to form a package.

In yet another aspect, the invention provides integrated circuits comprising two or more contacts formed according to the method of the invention. In one embodiment, an integrated circuit supported by a substrate includes at least two conductive contacts within openings in an insulative layer that are interconnected by a refractory metal layer that also lines the openings, the contacts comprising an electroless deposited conductive fill within the openings over a nucleation layer between the refractory metal layer and the conductive fill at the base of the openings. In another embodiment, the integrated circuit comprises an array of memory cells, internal circuitry, and at least two conductive contacts in openings within an insulative layer, at least one of the conductive contacts in electrical contact with an active area of the memory cell array, the conductive contacts fabricated according to the invention.

In a further aspect of the invention, electronic systems incorporating the contacts are provided. In one embodiment, the system comprises a microprocessor, and a memory device coupled to the microprocessor, the memory device comprising at least two conductive contacts formed according to the invention within openings in an insulative layer, and at least one of the conductive contacts in electrical contact with an active area of the memory cell array. In another embodiment, an electronic system comprises a processor, and an integrated circuit (e.g., a memory circuit such as a DRAM memory circuit) in communication with the processor, the integrated circuit comprising at least two conductive contacts in openings within a substrate (e.g., dielectric layer) such that at least one of the conductive contacts is in electrical contact with an active area of the memory cell array, the conductive contacts being formed according to the invention.

Advantageously, the invention provides an easy process for bottom up filling of multiple high aspect ratio features on a substrate. Fabricating contacts according to the present invention achieves a fast, reliable, and uniform plating of differing features in a semiconductor device, especially low surface potential areas such as contact holes and other openings. The base layer combined with the nucleation layer enables electrolytically assisted deposition (electric pulse). The invention also enables plating of contacts that would otherwise not initiate plating thereon.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE INVENTION

The invention will be described generally with reference to the drawings for the purpose of illustrating the present preferred embodiments only and not for purposes of limiting the same. The figures illustrate processing steps for use in the fabrication of semiconductor devices in accordance with the present invention. It should be readily apparent that the processing steps are only a portion of the entire fabrication process.

In the context of the current application, the term "semiconductor substrate" or "semiconductive substrate" or "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

The following description with reference to the figures provides illustrative embodiments of the formation of a conductive contact in a via or other opening in an integrated circuit (IC) in accordance with the present invention. Such description is only for illustrative purposes and the present invention can be utilized to provide a conductive contact or other feature in other constructions and devices. The present invention is not limited to the described illustrative devices.

Figure 1:
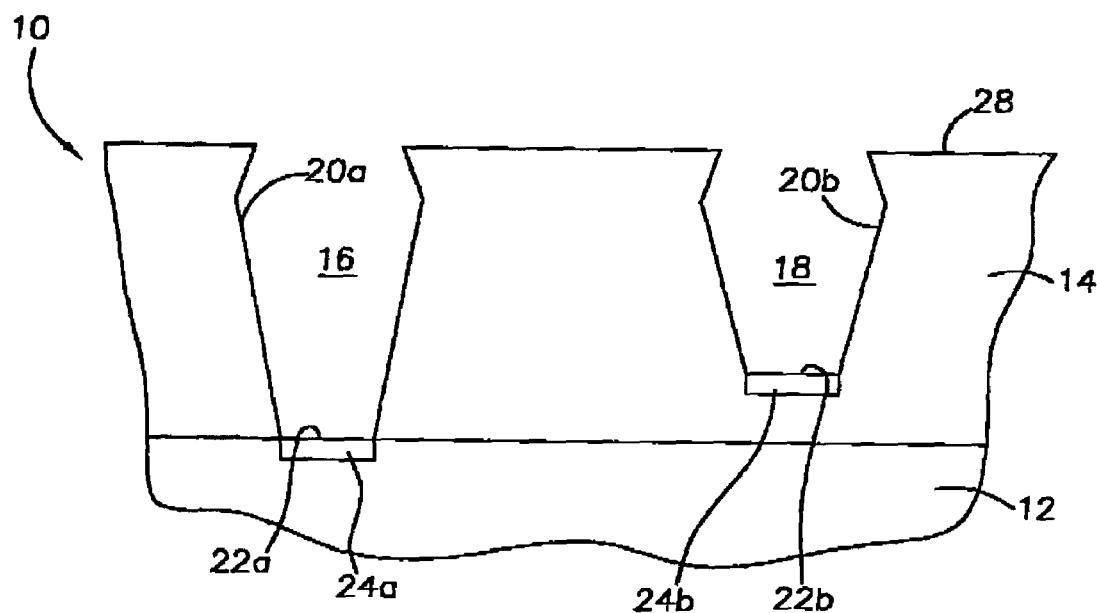
FIG. 1 is a diagrammatic, cross-sectional view of a semiconductor construction at a preliminary processing stage of an exemplary application of the present invention.

Steps in an embodiment of a method for fabricating a conductive contact according to an embodiment of the invention are illustrated in FIGS. 1–6. Initially, as shown in FIG. 1, a wafer fragment 10 at a preliminary processing step is provided. The wafer fragment 10 is shown as comprising a substrate 12, which can comprise an unprocessed semiconductor wafer or other substrate, the wafer with various process layers formed thereon including one or more semiconductor layers or other formations, and active or operable portions of semiconductor devices. A semiconductor device can comprise a transistor, capacitor, electrode, insulator, or any of a variety of components commonly utilized in semiconductor structures. In the illustrated example, the substrate 12 comprises a semiconductive material such as monocrystalline silicon that is lightly doped with a conductivity enhancing material.

An electrically insulative material layer 14 overlies the substrate 12. The insulative layer 14 is typically composed of a dielectric material, for example, silicon dioxide ($SiO_2$), phosphosilicate glass (PSG), borosilicate glass (BSG), and borophosphosilicate glass (BPSG), in a single layer or multiple layers, with the insulative layer 14 being BPSG in the illustrated example.

As shown, the insulative layer 14 has been etched to provide contact openings 16, 18 that can be contact holes, trenches, or other structure. The openings 16, 18 can be formed using a variety of fabrication techniques known in the art, including, for example, a dry etch utilizing photolithographic processing. The openings 16, 18 include sidewalls 20a, 20b and a base or bottom surface 22a, 22b. The openings 16, 18 can have sloped or tapered sidewalls 20a, 20b (as shown) or vertical sidewalls formed by an anisotropic etch. Typically, the openings 16,18 have a width of about 0.1–0.5 μm and a depth that is much greater than the width, with an aspect ratio up to about 20:1.

Following formation of the openings 16, 18, a cleaning step can be performed to remove residual materials such as residual photoresist, from the openings. Such a clean step can be performed by a conventional method known in the art, for example, by a wet etch or by stripping a sacrificial layer.

Figure 1A:
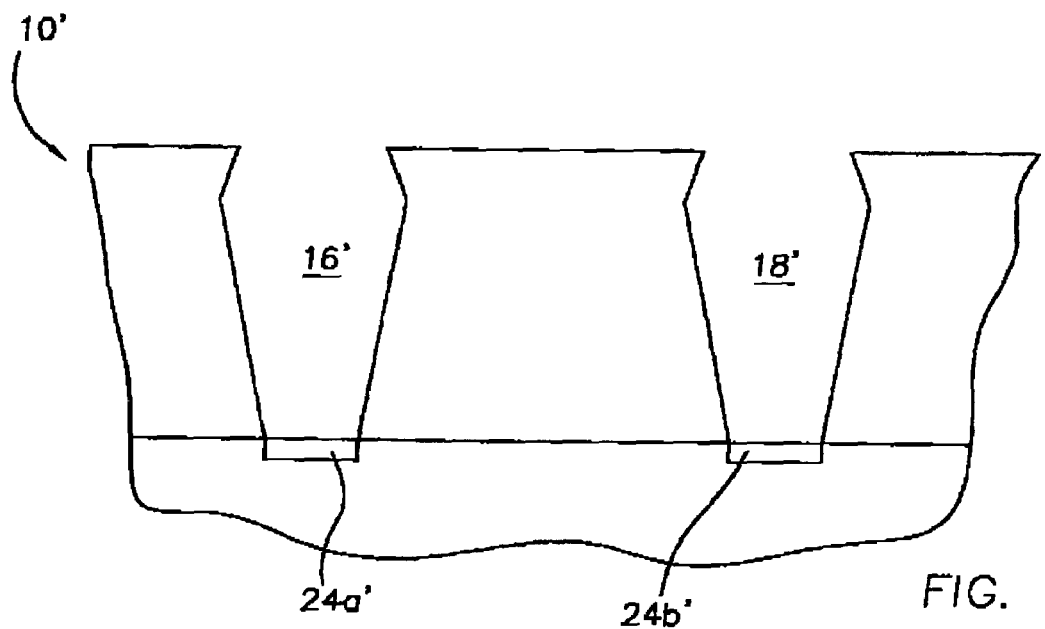
FIG. 1A is a dramatic, cross-sectional view of a semiconductor construction at a preliminary processing stage of another embodiment of the invention, showing the openings extending to active areas in the substrate.

As shown in FIG. 1, the features to be filled include an opening 16 that extends to an active area 24a, and an opening 18 that is situated and remains (ends) within the insulative (dielectric) layer 14, and can be connected to an electrically floating or isolated area 24b as shown. In another example illustrated in FIG. 1A, the openings 16', 18' can extend to active areas 24a', 24b' in the substrate 12' that are different conductivity types, for example, area 24a' comprising a P type conductivity enhancing dopant and area 24b' comprising an N type conductivity enhancing dopant. Thus, in the illustrated examples, the openings 16 and 18 (and 16' and 18') have a different electrical charge and surface potential.

A conventional electroless plating method to fill the openings 16, 18 includes forming a seed layer at the base of the openings over a barrier layer, and electroless depositing a conductive metal material onto the seed layer to fill the opening. In the use of such a method, the rate of filling the two openings 16, 18 is different due to the dissimilarities in surface potential between the two features, which can result in openings being inadequately filled with the conductive material. When forming the contacts within the openings 16, 18, it is desirable to bottom-up fill the openings at the same rate and simultaneously over the same time period.

Figure 2:
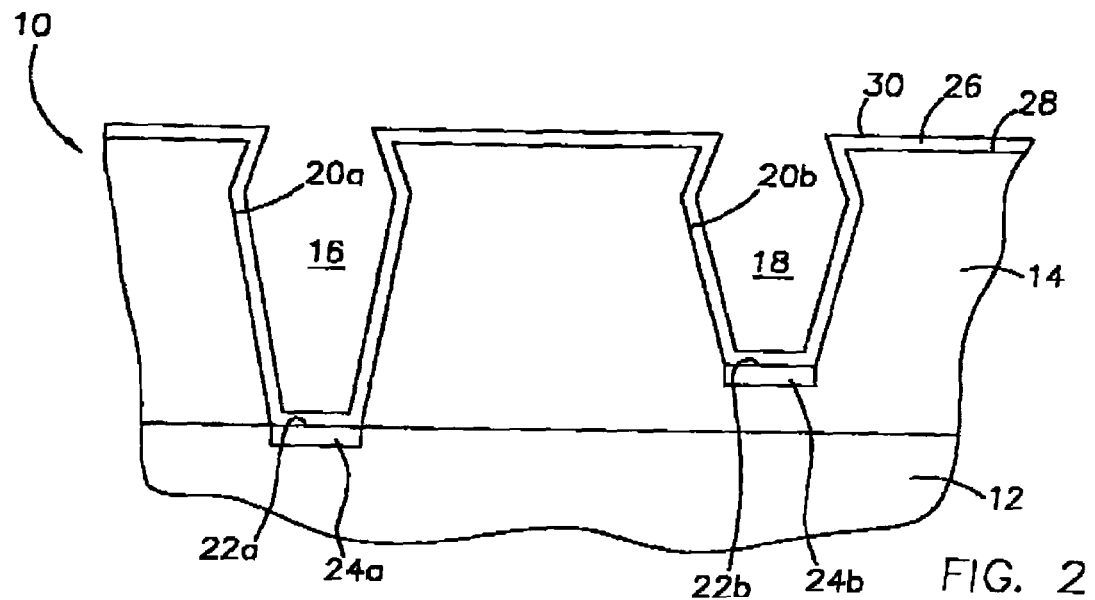
FIGS. 2–6 are views of the FIG. 1 wafer fragment at sequential processing steps subsequent to that of FIG. 1 according to an embodiment of the method of the invention.

Referring to FIG. 2, to achieve this according to the invention, an electrically conductive base layer 26, which is resistant to nucleation and growth from an electroless solution, is formed over the insulating layer 14 into and extending between the openings 16, 18, to interconnect and electrically short together the features (holes, etc.) to be plated and filled. In the areas where plating is desired, a more active surface (e.g., a noble metal), which is reactive with the electroless plating solution, is provided over the interconnecting base layer 26. The interconnecting base layer 26 establishes an equipotential between the two contacts 16, 18, so that the electroless deposition to fill the openings will be controlled by factors such as the concentration of the electroless solution, mass transport, etch, rather than the surface potential of the features themselves, and will be simultaneous and at the same rate.

The conductive interconnective base layer 26 is deposited generally as a continuous layer, preferably as a conformal layer, over the surface 28 of the insulative layer 14 and into the openings 16, 18 over the sidewalls 20a, 20b and the bottom surfaces 22a, 22b. Exemplary materials for forming the conductive base layer 26 include refractory metals such as tantalum (Ta), tungsten (W), niobium (Nb), rhenium (Re), ruthenium (Ru), and molybdenum (Mo), metals with low nucleation and growth rates in electroless solutions, nitride or oxide passivating materials (self-passivating to the electroless plating bath), and conductive nitrides and oxides that distribute potential but are difficult to nucleate or grow on (e.g., Ti, TiN, WN, etc.).

A preferred base layer 26 is formed as a graded layer of the metal and its metal nitride, for example, tantalum nitride (TaN), titanium nitride (TiN), and tungsten nitride (WN), with the metal nitride put down on the surface of the insulative layer 14 to enhance adhesion. A preferred base layer 26 comprises a graded layer of tantalum nitride (TaN) to tantalum (TaN/Ta), with the TaN deposited at the interface with the insulative (oxide) layer to enhance adhesion of the base layer 26. The base layer 26 can function as a conductive barrier layer that inhibits atomic migration of the fill material to the insulative (dielectric) layer 14 and/or as a diffusion barrier over the substrate 12.

The conductive material to form the interconnective base layer 26 can be deposited by conventional methods known and used in the art, for example, by sputter deposition or physical vapor deposition (PVD), by chemical vapor deposition (CVD), by atomic layer deposition (ALD), typical blanket electroless plating, evaporation using a conventional metal evaporator, and the like, to deposit a blanket layer of metal/base layer over the substrate.

In depositing the conductive material, the base layer 26 is generally thicker over the surface 28 of the insulative layer 14 and thinner over the sidewalls 20a, 20b and the bottom surfaces 22a, 22b of the openings 16, 18. A representative thickness of the base layer 26 over the feature is a minimum of about 10 Å to about 150 Å or greater, the upper limit on the thickness being dependent on the critical dimensions (CD) of the openings 16, 18, such that the feature (e.g., openings) are not pinched off (closed) by the thickness of the base layer 26, and the minimum amount provides an appropriate thickness covering the active area 24a, 24b at the base of the contact openings 16, 18.

Figure 3:
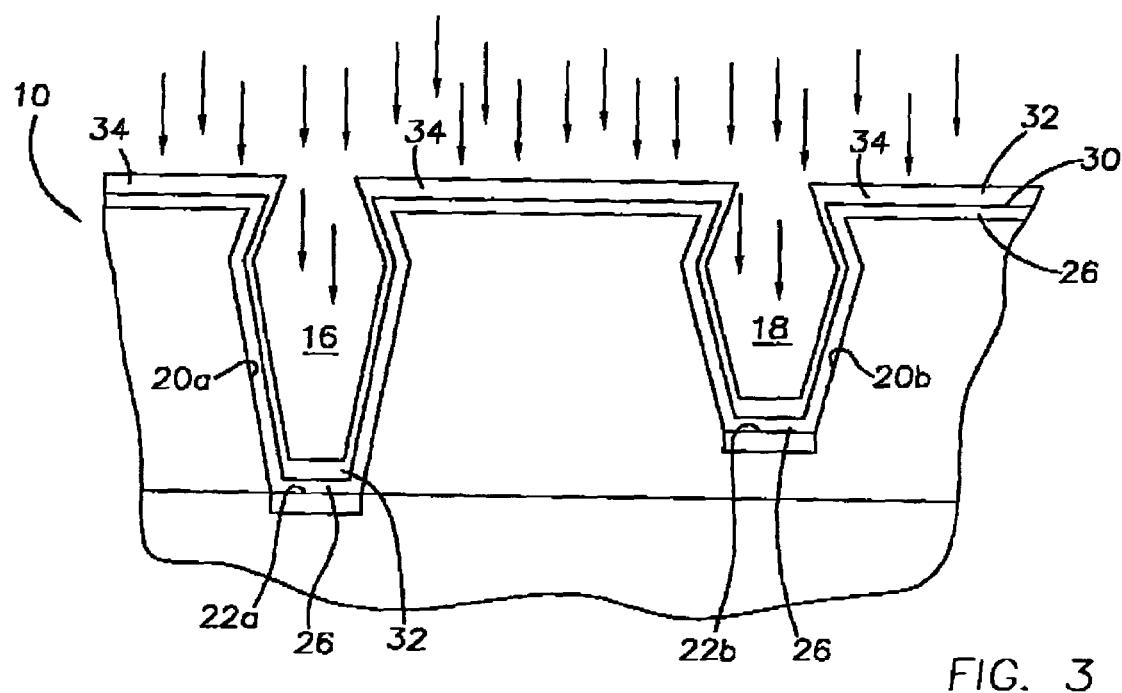

Referring now to FIG. 3, a nucleation layer 32 of a second conductive material is then directionally deposited (arrows) onto the surface 30 of the base layer 26 at the bottom of the openings 16, 18. The nucleation layer 32 can be deposited using a conventional directional sputtering or physical vapor deposition (PVD) technique including collimator sputtering, ion metal plasma (IMP) sputtering (ionized sputtering or PVD), and long throw sputtering (long throw PVD). Exemplary nucleation materials include non-refractory and more noble metals that will react with an electroless solution to plate the conductive fill to form the contacts, for example, copper (Cu), platinum (Pt), tungsten (W), silver (Ag), palladium (Pd), nickel (Ni), cobalt (Co), and the like.

The directional deposition step is performed to deposit material (atoms) in a "z direction" onto the surface 30 of the base layer 26 on the bottom of the openings 16, 18, to a thickness ($t_1$). As a result, a minimal amount of material is deposited from the side direction thereby reducing the thickness of the nucleation layer 32 on the base layer 26 along the upper portion of the sidewalls 20a, 20b of the contact openings 16, 18. The nucleation layer 32 deposited along the sidewalls of the openings tends to be thin, for example, up to about 10% sidewall coverage and up to about 70% bottom coverage. The directional deposition of nucleation material generally results in an overburden of the nucleation layer 34 formed over the base layer 26 outside of the openings.

Figure 4:
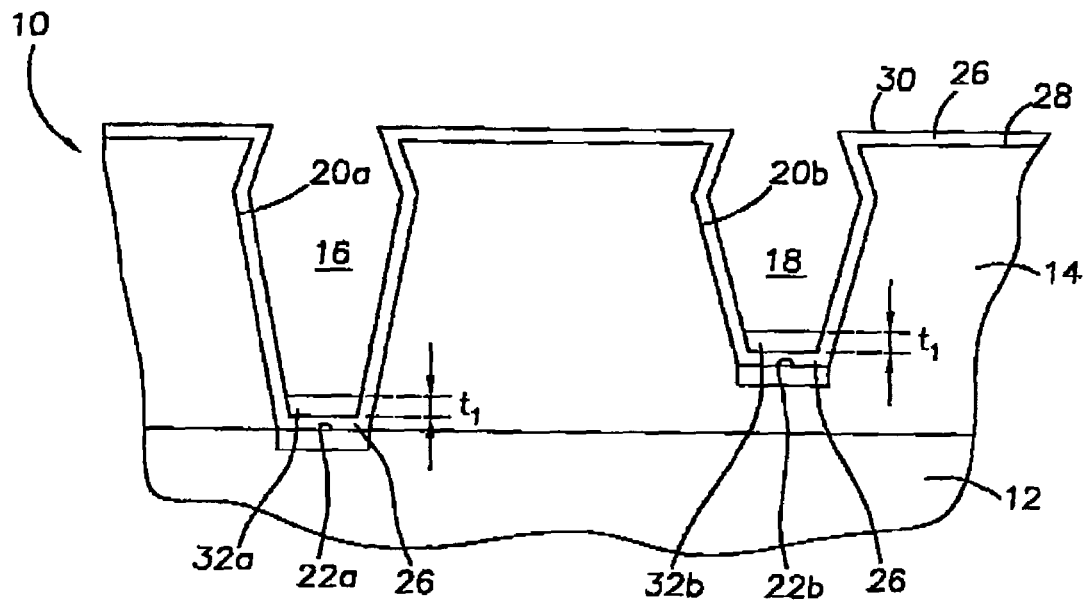

The overburden portion of the nucleation layer 32 outside of the openings 16, 18 (overlying the field areas) and nucleation material along the sidewalls 20a, 20b, is removed in a processing step back to the base layer 26, as depicted in FIG. 4, leaving the nucleation layers 32a, 32b at the base of the openings 16, 18, and the connecting base layer 26 intact over the insulation layer 14 between (connecting) and within the openings 16, 18. The nucleation layers 32a, 32b remaining at the bottom of the openings 16, 18, typically define a seed layer in a subsequent step to electrolessly deposit additional material to fill the openings with a plated material. For example, to fill the openings 16, 18 with a copper (Cu) fill 38, the nucleation layers 32a, 32b are typically a copper seed layer.

The overburden of nucleation layer 32 can be removed by conventional methods, for example, by a chemical mechanical polishing (CMP), by dry etching, and/or by wet etching. A protective layer such as photoresist can be formed within the openings 16, 18 during the processing step, and removed utilizing a suitable etch and/or ashing after the nucleation layer 34 at the top and sidewalls is removed. A preferred method of removal of the overburden (and sidewall) portion of the nucleation layer 32 is by a mass transport limited wet clean using a viscous solution such as phosphoric acid and limiting the contact of the solution to the upper portions of the openings 16, 18 to remove the overburden and sidewall portions of the nucleation layer 32, with no or limited contact with the nucleation layers 32a, 32b at the base of the openings. Where there is sidewall coverage remaining, the substrate can be exposed to an oxidating environment, for example, with a downstream oxygen ($O_2$) plasma that can be applied to oxidize a controlled thickness of all surfaces of the nucleation layer 32 within the openings to an oxidized metal (metallic oxide), followed by a mild acid wet clean to remove the oxidized metal and up to a minimal amount of the bottom nucleation layers 32a, 32b within the openings 16, 18.

Such processing methods to remove the overburden and sidewall portions of the nucleation layer 32 typically employ chemical agents such as oxidizers that are reactive with the nucleation material and can reduce the initial thickness ($t_1$) of the nucleation layers 32a, 32b within the openings. Accordingly, in initially forming the overall nucleation layer 32, enough material is deposited at the bottom of the openings 16, 18, to ensure that at least an active monolayer of the nucleation layer 32a, 32b remains after the removal of the overburden and sidewall portions of the nucleation layer 32. Thus, the initial thickness ($t_1$) of the nucleation layer 32 is tailored according to the aggressiveness of the processing system that is used in removing the overburden and sidewall portions of the nucleation layer 32. The thickness ($t_1$) of the nucleation layer 32 that is initially deposited within the openings 16, 18 (FIG. 4) is sufficient such that the post-processing thickness ($t_2$) of the nucleation layers 32a, 32b within the openings (FIG. 5) will be at least a monolayer.

Figure 5:
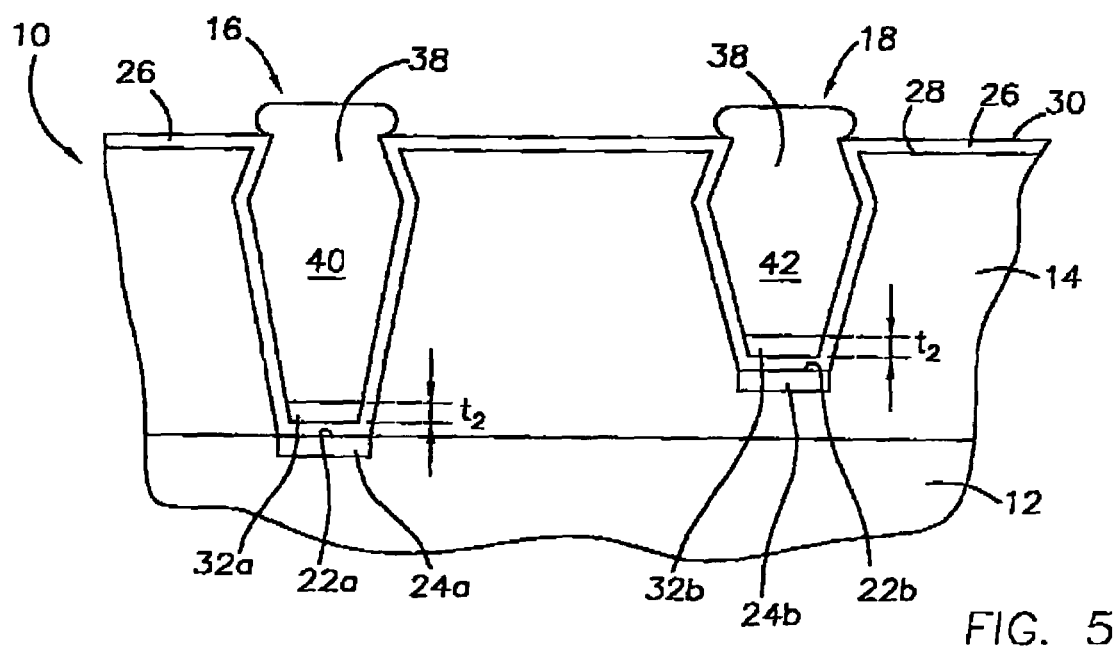

As illustrated in FIG. 5, a conventional electroless plating process is then used to deposit a conductive metal fill 38 into the openings 16, 18 onto the nucleation layers 32a, 32b to fill the openings 16, 18 from the bottom up, thus forming the conductive contacts 40, 42. Exemplary metal salts that can be used in the aqueous metal electroless solutions include, without limitation, salts of copper (Cu), nickel (Ni), cobalt (Co), silver (Ag), tungsten (W), and noble metals such as platinum (Pt), rhodium (Rh), iridium (Ir), ruthenium (Ru), osmium (Os), gold (Au), and palladium (Pd), or alloys including any of these metals. The plating solution can also include a boron- or phosphorus-containing reducing agent, for example, sodium borohydride, lithium borohydride, an aminoborane such as dimethylaminoborane (DMAB), and a hypophosphite such as ammonium hypophosphite, whereby boron or phosphorus is taken into the metal to form a doped metal that incorporates boron or phosphorus, for example, CoP (cobalt containing phosphorus), PtP (platinum containing phosphorus), NiP (nickel containing phosphorus), Ni/NiP or Ni/NiB (nickel-nickel containing phosphorus or boron), NiWP (nickel-tungsten alloy containing phosphorus), CoWP (cobalt-tungsten alloy containing phosphorus), CoMoP (cobalt-molybdenum alloy containing phosphorus), NiMoP (nickel-molybdenum alloy containing phosphorus), and CoWB (cobalt-tungsten alloy with boron), and the like. Additional reducing agents include formaldehyde and hydrazine, which are not incorporated into the deposited materials. Electroless plating tools and solutions for electrolessly plating these metals are known in the art and commercially available.

The process of electroless plating of a metal generally comprises dipping the wafer 10 with the deposited nucleation layers 32a, 32b into a solution including at least one inorganic metal salt (e.g., cupric sulfate) and at least one agent that reduces the metal salt (reducing agent). To terminate the electroless deposition, the wafer 10 is removed from the solution and rinsed to remove residual bath liquid and particles.

Optionally, if the metal fill material is not self-initiating on the nucleation layer 32 (32a, 32b), a pre-rinse and/or activation step can be conducted as needed prior to the plating step. An exemplary pre-rinse treatment process uses an acidic solution, for example, a citrate/citric acid solution or a hydrofluoric acid (HF) solution to remove an oxide layer or contaminants from the surface of the nucleation layer. Another exemplary activation treatment selectively deposits a surface activating agent such as a noble metal and/or metal salt thereof, for example, palladium (Pd) and/or palladium salt such as palladium nitrate ($Pd(NO_3)_2$), palladium sulfate ($PdSO_4$), and palladium chloride ($PdCl_2$), to form an activated surface area at the desired locations.

Figure 6:
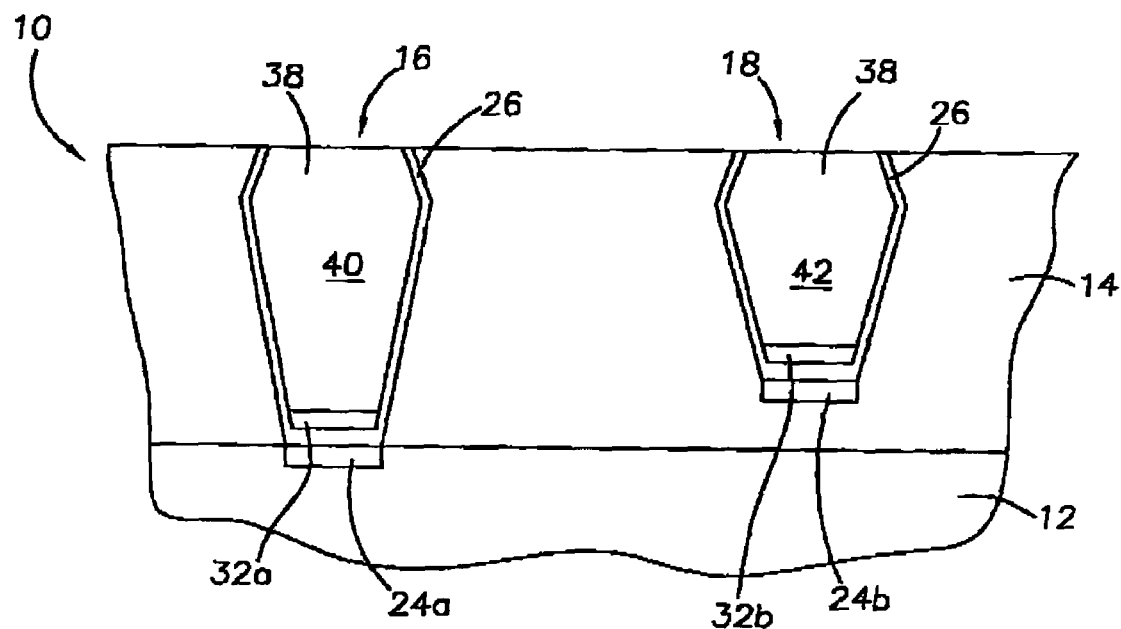

Referring now to FIG. 6, after formation of the contacts 40, 42, the overburden (excess) portion of the deposited metal fill 38 and the base layer 26 on the surface are removed while leaving the desired metal 38 within the openings 16, 18 as depicted. Unwanted surface metal 38 and the base layer 26 can be removed according to known and used methods in the art. Exemplary methods of removing metal material include a conventional dry etch or chemical mechanical polishing (CMP) of an upper surface of the construction to form a planarized upper surface. The finished construction includes conductive contacts 40, 42 formed within the openings 16, 18.

Thus, an exemplary contact structure 40, 42 depicted in FIG. 6, includes a base layer 26 (e.g., a graded TaN/Ta layer), a directionally deposited nucleation layer 32a, 32b that is at least a monolayer thick (e.g., copper, cobalt), and an overlying electrolessly deposited fill 38 (e.g., copper, cobalt). The resulting contacts 40, 42 can be used in a variety of applications including, for example, programmable memory devices, programmable resistor and capacitor devices, optical devices, and sensors, among others.

Figure 7:
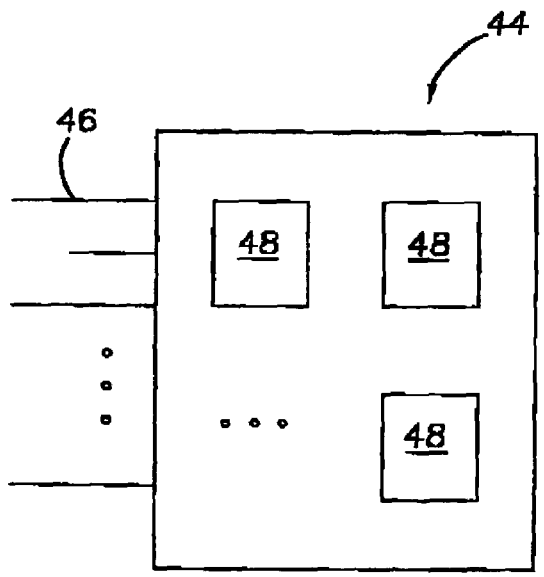
FIG. 7 is a block diagram of a circuit module according to an embodiment of the present invention.

FIG. 7 is a block diagram of an embodiment of a circuit module 44 in which the present invention can be incorporated. Such modules, devices and systems (e.g., processor systems) incorporating the module are described and illustrated in U.S. Pat. No. 6,437,417 (Gilton) and U.S. Pat. No. 6,465,828 (Agarwal), the disclosures of which are incorporated by reference herein. In brief, two or more dies may be combined into a circuit module 44 to enhance or extend the functionality of an individual die. Circuit module 44 may be a combination of dies representing a variety of functions, or a combination of dies containing the same functionality. One or more dies of the circuit module can contain circuitry, or integrated circuit devices, that includes at least one contact in accordance with the embodiments of the present invention. The integrated circuit devices can include a memory cell that comprises a contact as discussed in the various embodiments in accordance with the invention.

Some examples of a circuit module include memory modules, device drivers (on a BIOS or EPROM), power modules, communication modems, processor modules, and application-specific modules, and may include multilayer, multichip modules. Circuit module 44 may be a subcomponent of a variety of electronic systems, such as a clock, a television, a cell phone, a personal computer, an automobile, an industrial control system, an aircraft, among others. Circuit module 44 will have a variety of leads 46 extending therefrom and coupled to dies 48 providing unilateral or bilateral communication and control.

The circuit module can be incorporated, for example, into an electronic system that comprises a user interface, for example, a keyboard, monitor, display, printer, speakers, etc. One or more circuit modules can comprise a microprocessor that provides information to the user interface, or is otherwise programmed to carry out particular functions as is known in the art. The electronic system can comprise, for example, a computer system including a processor and a memory system as a subcomponent, and optionally user interface components, and other associated components such as modems, device interface cards, etc. Examples of memory circuits include but are not limited to DRAM (Dynamic Random Access Memory), SRAM (Static Random Access Memory), Flash memories, a synchronous DRAM such as SGRAM (Synchronous Graphics Random Access Memory), SDRAM (Synchronous Dynamic Random Access Memory), SDRAM II, and DDR SDRAM (Double Data Rate SDRAM), other non-volatile memories, as well as Synchlink or Rambus DRAMs and other emerging memory technologies.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of filling two or more openings in a substrate, the openings comprising a bottom surface and sidewalls, at least two of the openings extending to areas having different surface potentials, the method comprising the steps of:
   forming a conductive base layer over the substrate to connect the at least two openings and over the bottom surfaces and sidewalls of the openings, the base layer comprising a first conductive material;
   directionally depositing a second conductive material to form a nucleation layer over the base layer over the bottom surface of the openings;
   removing the nucleation layer over the base layer on the sidewalls of the openings and over the base layer outside the openings such that the nucleation layer remains over the base layer over the bottom surface of the openings; and
   electroless depositing a conductive doped metal comprising boron or phosphorus onto the nucleation layer within the openings fill the openings.

2. A method of filling two or more openings in a substrate, the openings comprising a bottom surface and sidewalls, at least two of the openings extending to areas having different surface potentials, the method comprising the steps of:
   forming a base layer of a first conductive material within the openings and over the substrate to connect at least two of the openings;
   forming a nucleation layer comprising a second conductive material over the base layer by a directional deposition process;
   removing the nucleation layer over the substrate and sidewalls of the openings such that the nucleation layer remains over the base layer over the bottom surface of the openings; and
   electroless depositing a conductive doped metal comprising boron or phosphorus onto the nucleation layer within the openings to fill the openings.

3. A method of filling two or more openings in a substrate, the openings comprising a bottom surface, at least two of the openings extending to areas having different surface potentials, the method comprising the steps of:
   forming a base layer of a first conductive material within the openings and over the substrate to connect at least two of the openings;
   forming a nucleation layer comprising a second conductive material over the base layer by a directional deposition process;
   selectively removing the nucleation layer such that the nucleation layer remains over the base layer over the bottom surface of the openings; and
   electroless depositing a conductive doped metal comprising boron or phosphorus onto the nucleation layer within the openings to fill the openings.

4. A method of filling two or more openings in a substrate, the openings comprising a bottom surface and sidewalls, at least two of the openings extending to areas having different surface potentials, and at least two of the openings comprising different surface potentials, the method comprising the steps of:
   forming a continuous base layer comprising a first conductive material over the substrate connecting the at least two openings and extending into the openings over the bottom surface and sidewalls;
   directionally depositing a nucleation layer comprising a second conductive material in the at least two openings over the base layer over the bottom surface of the openings;
   selectively removing the nucleation layer such that the nucleation layer remains over the base layer over the bottom surface of the at least two openings; and
   electroless depositing a conductive doped metal comprising boron or phosphorus onto the nucleation layer within the at least two openings to fill the openings, wherein the at least two openings are filled about simultaneously and at about the same rate.

5. A method of filling two or more openings in a substrate, the openings comprising a bottom surface and sidewalls, at least two of the openings extending to areas having different surface potentials, and at least two of the openings comprising different surface potentials, the method comprising the steps of:
   forming a base layer of a first conductive material over the bottom surface and sidewalls of the openings and over the substrate to connect the at least two openings;
   forming a nucleation layer comprising a second conductive material over the base layer by a directional deposition process;

selectively removing the nucleation layer such that the nucleation layer remains over the base layer over the bottom surface of the at least two openings; and electroless depositing a conductive doped metal comprising boron or phosphorus onto the nucleation layer within the at least two openings to fill the openings, wherein the at least two openings are filled about simultaneously and at about the same rate.

6. The method of claim 5, wherein one of the at least two openings is strapped to an active area, and another of the at least two openings is strapped to an inactive area.

7. A method of filling openings in a substrate, the openings comprising a bottom surface and sidewalls, one of two openings extending to an active area and another of the two openings extending to an electrically floating area, the method comprising the steps of:

forming a base layer of a first conductive material over the bottom surface and sidewalls of the two openings and over the substrate to connect the two openings;

forming a nucleation layer comprising a second conductive material over the base layer by a directional deposition process;

selectively removing the nucleation layer such that the nucleation layer remains over the base layer over the bottom surface of the two openings; and electroless depositing a conductive doped metal comprising boron or phosphorus onto the nucleation layer within the two openings to fill the openings, wherein the two openings are filled about simultaneously and at about the same rate.

8. A method of filling two or more openings in a substrate, the openings comprising a bottom surface and sidewalls, at least two of the opening extending to areas having different surface potentials, the method comprising the steps of:

forming a base layer comprising a refractory metal extending into the openings over the bottom surface and sidewalls and over the substrate to connect the at least two openings;

directionally depositing a conductive metal to form a nucleation layer over the base layer over the bottom surface of the openings;

selectively removing the nucleation layer to expose the base layer along the sidewalls of the opening and over the base layer outside the openings, wherein the nucleation layer remains over the base layer at the bottom surface of the openings; and contacting the nucleation layer with the surface activating agent; and electroless plating a conductive metal onto the nucleation layer within the openings to fill the openings.

9. The method of claim 8, wherein the refractory metal is selected from the group consisting of tantalum, titanium, tungsten, ruthenium, and molybdenum.

10. The method of claim 8, wherein the base layer comprises a graded layer of a refractory metal and the refractory metal nitride.

11. The method of claim 8, wherein the base layer comprises a graded layer of tantalum nitride to tantalum.

12. The method of claim 8, wherein the base layer comprises a graded layer of titanium nitride to titanium.

13. The method of claim 8, wherein the step of forming the base layer comprises a process selected from the group consisting of physical vapor deposition, chemical vapor deposition, atomic layer deposition, blanket electroless plating, and metal evaporation.

14. The method of claim 8, wherein the step of directionally depositing the conductive material to form the nucleation layer comprises a directional physical vapor deposition process selected from the group consisting of collimator sputtering, ion metal plasma sputtering, and long throw sputtering.

15. The method of claim 8, wherein the step of removing the nucleation layer comprises a process selected from the group consisting of chemical mechanical polishing, dry etching, and wet etching.

16. The method of claim 8, wherein the step of removing the nucleation layer comprises a mass transport limited wet clean.

17. The method of claim 8, wherein the step of removing the nucleation layer comprises exposing to an oxidating environment and an acidic solution.

18. The method of claim 8, wherein the electroless deposited conductive metal is selected from the group consisting of copper, nickel, cobalt, silver, tungsten, platinum, rhodium, iridium, ruthenium, osmium, palladium, gold, and alloys thereof.

19. The method of claim 8, wherein the electroless deposited conductive material comprises a doped metal comprising boron or phosphorus.

20. The method of claim 8, further comprising, prior to the step of electroless depositing the conductive material, the step of applying an acidic pre-rinse solution to the nucleation layer within the opening.

21. The method of claim 8, wherein the surface activating agent comprises a noble metal, a noble metal salt, or a combination thereof.

22. The method of claim 8, wherein the surface activating agent comprises palladium, a palladium salt, or a mixture thereof.

23. The method of claim 8, further comprising removing overburden of the electroless deposited conductive material outside of the openings.

24. The method of claim 23, wherein the step of removing the overburden comprises a process selected from the group consisting of dry etching, wet etching, and chemical mechanical polishing.

25. A method of filling openings in a substrate, each of the openings comprising a bottom surface and sidewalls, at least two of the openings extending to areas having different surface potentials, the method comprising the steps of:

depositing a layer comprising a refractory metal onto the substrate by a process selected from the group consisting of physical vapor deposition, chemical vapor deposition, atomic layer deposition, blanket electroless plating, and metal evaporation, the refractory metal layer extending into the openings over the bottom surface and sidewalls and over the substrate to connect the at least two openings;

directionally depositing a first conductive material by a process selected from the group consisting of collimator sputtering, ion metal plasma sputtering, and long throw sputtering, to form a nucleation layer over the refractory metal layer over the bottom surface of each of the openings;

removing the nucleation layer from the sidewalls of the openings and over the refractory metal layer outside the openings, wherein at least a monolayer of the nucleation layer remains over the refractory metal layer on the bottom surface of the openings; and filling the openings by electroless deposition of a second conductive material comprising a boron- or phosphorus-doped metal onto the nucleation layer within the openings.

26. The method of claim 25, wherein the first and second conductive materials are selected from the group consisting of copper, nickel, cobalt, silver, tungsten, platinum, rhodium, iridium, ruthenium, osmium, palladium, gold, and alloys thereof.

27. The method of claim 25, wherein the nucleation layer comprises a metal selected from the group consisting of copper, nickel, cobalt, silver, gold, tungsten, platinum, rhodium, iridium, ruthenium, osmium, and palladium; and
the electroless deposited second conductive material comprises an alloy thereof.

28. A method of filling openings in a dielectric layer with a conductive metal comprising a boron- or phosphorus-doped metal, each of the openings comprising a botton surface and sidewalls, at least two of the openings extending to areas having different surface potentials, the method comprising the steps of:
depositing titanium nitride and titanium over the dielectric layer to form a graded titanium nitride to titanium layer lining and connecting the at least two openings;
directionally depositing a copper nucleation layer onto the graded titanium nitride/titanium layer on the bottom surface of the openings;
selectively removing the copper nucleation layer from over the graded titanium nitride/titanium layer along the sidewalls of the openings and outside the openings, wherein the nucleation layer remains over the graded layer on the bottom surface of the openings; and
electroless depositing the boron- or phosphorus-doped conductive metal onto the copper nucleation layer to fill the openings, wherein the at least two openings are filled at about the same rate.

29. A method of filling openings in a dielectric layer with a conductive metal, comprising a boron- or phosphorus-doped metal, each of the openings comprising a bottom surface and sidewalls, at least two of the openings extending to areas having different surface potentials, the method comprising the steps of:
depositing tantalum nitride and tantalum over the dielectric layer to form a graded tantalum nitride to tantalum layer lining and connecting the at least two openings;
directionally depositing a copper nucleation layer onto the graded tantalum nitride/tantalum layer on the bottom surface of the openings;
selectively removing the copper nucleation layer from over the graded tantalum nitride/tantalum layer along the sidewalls of the openings and outside the openings, wherein the nucleation layer remains over the graded layer on the bottom surface of the openings; and
electroless depositing the boron- or phosphorus-doped conductive metal onto the copper nucleation layer to fill the openings, wherein the at least two openings are filled at about the same rate.

30. A method of electroless plating a metal to simultaneously fill openings within a substrate, each of the openings comprising a bottom surface and sidewalls, at least two of the openings extending to areas having different surface potentials, the method comprising the steps of:
forming a layer of a refractory metal extending into the openings over the bottom surface and sidewalls and over the substrate to connect the at least two openings;
directionally depositing a conductive nucleation material over the substrate by physical vapor deposition to form a nucleation layer on the refractory metal layer over the bottom surface within the openings, with minimal deposit of the conductive nucleation material onto the sidewalls of the openings;
removing the nucleation material from the sidewalls of the openings and over the refractory metal layer outside the openings, wherein at least a monolayer of the nucleation layer remains on the refractory metal layer on the bottom surface of the openings; and
electroless depositing a conductive boron- or phosphorus-doped metal onto the nucleation layer to bottom up fill the openings.

31. A method of semiconductive wafer processing, comprising forming conductive structures by the steps of:
providing a semiconductor wafer comprising a dielectric layer on a substrate, and a plurality of openings in the dielectric layer, each of the openings comprising a bottom surface and sidewalls, and at least two of the openings extending to areas having different surface potentials;
forming a conformal refractory metal layer extending into the openings over the bottom surface and sidewalls and over the dielectric layer to connect the at least two openings;
directionally depositing a nucleation layer by physical vapor deposition onto the refractory metal layer on the bottom surface of the openings, with minimal deposit of the nucleation layer onto the sidewalls of the openings;
removing the nucleation layer from the sidewalls of the opening and over the refractory metal layer outside the openings, wherein at least a monolayer of the nucleation layer remains on the refractory metal layer on the bottom surface of the openings; and
electroless depositing a conductive boron- or phosphorus-doped metal onto the nucleation layer to form the conductive structures within the openings.

32. The method of claim 31, wherein the conductive structures are selected from the group consisting of interconnects and contacts.

33. A method of fabricating conductive contacts in a plurality of openings in a substrate, each opening defined by a bottom surface and sidewalls of the substrates at least two of the openings extending to areas having different surface potentials, the method comprising the steps of:
forming a first conductive material layer over the bottom surface and the sidewalls of the substrate within the openings, and over the substrate to connect the at least two openings;
directionally depositing a second conductive material layer to form a nucleation layer over the first conductive material layer over the bottom surface of the openings;
removing the second conductive material layer such that the nucleation layer remains solely over the bottom surface of the openings; and
electroless plating a third conductive material layer comprising boron- or phosphorus-doped metal onto the nucleation layer to fill the openings.

34. The method of claim 33, wherein the at least two openings are filled about simultaneously and at about the same rate.

35. A method of fabricating conductive contacts in openings in a substrate, each of the openings defined by a bottom surface and sidewalls of the substrate, at least two of the openings extending to areas having different surface potentials, the method comprising the steps of:
forming a first conductive material layer over the bottom surface of the substrate within the openings and over the substrate to connect the at least two openings;

directionally depositing a second conductive material layer to form a nucleation layer over the first conductive material layer over the bottom surface of the openings;

selectively removing the second conductive material layer such that the nucleation layer remains over the bottom surface of the openings; and electroless plating a third conductive material layer comprising boron- or phosphorus-doped metal onto the nucleation layer to fill the openings.

36. A method of fabricating conductive contacts in openings in a substrate, each of the openings defined by a bottom surface and sidewalls of the substrate, at least two of the openings extending to areas having different surface potentials, the method comprising the steps of:

forming a first conductive material layer over the bottom surface of the substrate within the openings and over the substrate to connect the at least two openings;

directionally depositing a second conductive material layer to form a nucleation layer over the first conductive material layer over the bottom surface of the openings;

selectively removing the second conductive material layer such that the nucleation layer remains over the first conductive material layer over the bottom surface of the openings; and electroless plating a third conductive material layer comprising boron- or phosphorus-doped metal onto the nucleation layer to fill the at least two connected openings about simultaneously and at about the same rate.

37. A method of fabricating conductive contacts in openings in a substrate, each of the openings defined by a bottom surface and sidewalls of the substrate, at least two of the openings extending to areas having different surface potentials, the method comprising the steps of:

forming a layer of a refractory metal over the bottom surface of the substrate within the openings and over the substrate to connect the at least two openings;

directionally depositing a conductive material layer to form a nucleation layer over the refractory metal layer over the bottom surface of the openings;

selectively removing the conductive material layer such that the nucleation layer remains solely over the refractory metal layer over the bottom surface of the openings; and electroless plating a third conductive material layer comprising boron- or phosphorus-doped metal onto the nucleation layer to fill the openings.

38. A method of fabricating conductive contacts in openings in a substrate, each of the openings defined by a bottom surface and sidewalls of the substrate, at least two of the openings extending to areas having different surface potentials, the method comprising the steps of:

forming a layer of a refractory metal over the bottom surface of the substrate within the openings and over the substrate to connect the at least two openings;

directionally depositing a conductive material layer to form a nucleation layer over the refractory metal layer over the bottom surface of the openings;

selectively removing the conductive material layer such that the nucleation layer remains over the refractory metal layer over the bottom surface of the openings; and electroless plating a third conductive material layer comprising boron- or phosphorus-doped metal onto the nucleation layer to fill the at least two openings about simultaneously and at about the same rate.

39. A method of fabricating conductive contacts in openings in a substrate, each of the openings defined by a bottom surface and sidewalls of the substrate, at least two of the openings extending to areas having different surface potentials, the method comprising the steps of:

forming a first conductive material layer over the bottom surface of the substrate within the openings and over the substrate to connect the at least two openings;

directionally depositing a second conductive material layer to form a nucleation layer over the first conductive material layer over the bottom surface of the openings;

selectively removing the second conductive material layer such that the nucleation layer remains over the first conductive material layer over the bottom surface of the openings; and electroless plating a third conductive material layer comprising boron- or phosphorus-doped metal onto the nucleation layer to fill the at least two openings at about the same rate and about simultaneously.

40. A method of fabricating conductive contacts in openings in a substrate, each of the openings defined by a bottom surface and sidewalls of the substrate, at least two of the openings extending to areas having different surface potentials, one of said two openings strapped to an active area and another of the said two openings strapped to an inactive area, the method comprising the steps of:

forming a first conductive material layer over the bottom surface of the substrate within the openings and over the substrate to connect the at least two openings;

directionally depositing a second conductive material layer to form a nucleation layer over the first conductive material layer over the bottom surface of the openings;

selectively removing the second conductive material layer such that the nucleation layer remains over the first conductive material layer over the bottom surface of the openings; and electroless plating a third conductive material layer comprising boron- or phosphorus-doped metal onto the nucleation layer to fill the at least two openings at about the same rate and about simultaneously.

41. A method of fabricating conductive contacts in openings in a substrate, each of the openings defined by a bottom surface and sidewalls of the substrate, at least two of the openings extending to areas having different surface potentials, one of said two openings extending to an active area and another of said two openings extending to an electrically floating area, the method comprising the steps of:

forming a first conductive material layer over the bottom surface of the substrate within the openings and over the substrate to connect the at least two openings;

directionally depositing a second conductive material layer to form a nucleation layer over the first conductive material layer over the bottom surface of the openings;

selectively removing the second conductive material layer such that the nucleation layer remains over the first conductive material layer over the bottom surface of the openings; and electroless plating a third conductive material layer comprising boron- or phosphorus-doped metal onto the nucleation layer to fill the at least two openings at about the same rate and about simultaneously.

42. A method of fabricating conductive contacts in openings in a substrate, each of the openings defined by a bottom surface and sidewalls of the substrate, at least two of the openings extending to areas having different surface potentials, the method comprising the steps of:

forming a first conductive material layer over the bottom surface and the sidewalls of the substrate within the openings and over the substrate to connect the at least two openings;

directionally depositing a second conductive material layer to form a nucleation layer over the first conductive material layer over the bottom surface of the openings;

selectively removing the second conductive material layer such that the nucleation layer remains over the first conductive material layer over the bottom surface of the openings;

contacting the nucleation layer with a surface activating agent; and electroless plating a third conductive material layer comprising boron- or phosphorus-doped metal onto the nucleation layer to fill the openings.

43. The method of claim 42, wherein the at least two openings are filled about simultaneously and at about the same rate.

44. A method of fabricating conductive contacts in openings in a substrate, each of the openings defined by a bottom surface and sidewalls of the substrate, at least two of the openings extending to areas having different surface potentials, the method comprising the steps of:

forming a first conductive material layer over the bottom surface of the substrate within the openings and over the substrate to connect the at least two openings;

directionally depositing a second conductive material layer to form a nucleation layer over the first conductive material layer over the bottom surface of the openings;

selectively removing the second conductive material layer from the substrate such that the nucleation layer remains over the first conductive material layer over the bottom surface of the openings; and electroless plating a third conductive material layer comprising boron- or phosphorus-doped metal onto the nucleation layer to fill the openings.

45. A method of fabricating conductive contacts in openings in a substrate, each of the openings defined by a bottom surface and sidewalls of the substrate, at least two of the openings extending to areas having different surface potentials, the method comprising the steps of:

forming a layer of a refractory metal over the bottom surface of the substrate within the openings and over the substrate to connect at least two of the openings;

directionally depositing a conductive material layer to form a nucleation layer over the refractory metal layer over the bottom surface of the openings;

selectively removing the conductive material layer such that the nucleation layer remains over the refractory metal layer over the bottom surface of the openings.

electroless plating a third conductive material layer comprising boron- or phosphorus-doped metal onto the nucleation layer to fill the openings.

46. A method of fabricating conductive contacts in openings in a substrate, each of the openings defined by a bottom surface and sidewalls of the substrate, at least two of the openings extending to areas having different surface potentials, the method comprising the steps of:

forming a first conductive material layer over the bottom surface of the substrate within the openings and over the substrate to connect the at least two openings;

directionally depositing a second conductive material layer to form a nucleation layer over the first conductive material layer over the bottom surface of the openings; and selectively removing the second conductive material layer such that the nucleation layer remains over the first conductive material layer over the bottom surface of the openings; and electroless plating a third conductive material layer comprising boron- or phosphorus-doped metal onto nucleation layer to fill the openings.

47. A method of fabricating conductive contacts in openings in a substrate, each of the openings defined by a bottom surface and sidewalls of the substrate, at least two of the openings extending to areas having different surface potentials wherein one of the openings is strapped to an active area and another of the openings is strapped to an inactive area, the method comprising the steps of:

forming a first conductive material layer over the bottom surface of the substrate within the openings and over the substrate to connect the at least two openings;

directionally depositing a second conductive material layer to form a nucleation layer over the first conductive material layer over the bottom surface of the openings; and selectively removing the second conductive material layer such that the nucleation layer remains over the first conductive material layer over the bottom surface of the openings; and electroless plating a third conductive material layer comprising boron- or phosphorus-doped metal onto the nucleation layer to fill the openings.

48. A method of fabricating conductive contacts in openings in a substrate, each of the openings defined by a bottom surface and sidewalls of the substrate, at least two of the openings extending to areas having different surface potentials wherein one of the openings extends to an active area and another of the openings extends to an electrically floating area, the method comprising the steps of:

forming a first conductive material layer over the bottom surface of the substrate within the openings and over the substrate to connect the at least two openings;

directionally depositing a second conductive material layer to form a nucleation layer over the first conductive material layer over the bottom surface of the openings; and selectively removing the second conductive material layer such that the nucleation layer remains over the bottom surface of the openings; and electroless plating a third conductive material layer comprising boron- or phosphorus-doped metal onto the nucleation layer to fill the openings.

49. A method of fabricating conductive contacts in openings in a substrate, each of the openings defined by a bottom surface and sidewalls of the substrate, at least two of the openings extending to areas having different surface potentials, the method comprising the steps of:

forming a refractory metal layer over the bottom surface of the substrate within the openings and over the substrate to connect the at least two openings;

directionally depositing a second conductive material layer to form a nucleation layer over the refractory metal layer over the bottom surface of the openings; and selectively removing the second conductive material layer such that the nucleation layer remains over the refractory metal layer over the bottom surface of the openings; and electroless plating a third conductive material layer comprising boron- or phosphorus-doped metal onto the nucleation layer to fill the openings.

50. A method of fabricating conductive contacts in openings in a substrate, each opening defined by a bottom surface and sidewalls of the substrate, at least two of the openings extending to areas having different electrical charges wherein one of the openings extends to an active area, the method comprising the steps of:
   forming a first conductive material layer over the bottom surface and the sidewalls of the substrate within the openings, and over the substrate to connect the at least two openings;
   directionally depositing a second conductive material layer to form a nucleation layer over the first conductive material layer over the bottom surface of the openings;
   removing the second conductive material layer such that the nucleation layer remains solely over the bottom surface of the openings; and
   electroless plating a third conductive material layer comprising boron- or phosphorus-doped metal onto the nucleation layer to fill the openings, wherein the at least two openings are filled about simultaneously.

51. A method of fabricating conductive contacts in openings in a substrate, each opening defined by a bottom surface and sidewalls of the substrate, at least two of the openings extending to areas having different surface potentials wherein one of the openings extends to an active area, the method comprising the steps of:
   forming a first conductive material layer over the bottom surface and the sidewalls of the substrate within the openings, and over the substrate to connect the at least two openings;
   directionally depositing a second conductive material layer to form a nucleation layer over the first conductive material layer over the bottom surface of the openings;
   removing the second conductive material layer such that the nucleation layer remains solely over the bottom surface of the openings; and
   electroless plating a third conductive material layer comprising boron- or phosphorus-doped metal onto the nucleation layer to fill the openings, wherein the at least two openings are filled about simultaneously.

52. A method of fabricating conductive contacts in openings in a substrate, each opening defined by a bottom surface and sidewalls of the substrate, at least two of the openings extending to areas having different surface potentials wherein one of the openings extends to an active area, the method comprising the steps of:
   forming a first conductive material layer over the bottom surface and the sidewalls of the substrate within the openings, and over the substrate to connect the at least two openings;
   directionally depositing a second conductive material layer to form a nucleation layer over the first conductive material layer over the bottom surface of the openings;
   removing the second conductive material layer such that the nucleation layer remains solely over the bottom surface of the openings; and
   electroless plating a third conductive material layer comprising boron- or phosphorus-doped metal onto the nucleation layer to fill the openings, wherein the at least two openings are filled about simultaneously.

53. A method of fabricating conductive contacts in openings in a substrate, each opening defined by a bottom surface and sidewalls of the substrate, at least two of the openings extending to areas having different surface potentials wherein one of the openings extends to an inactive area, the method comprising the steps of:
   forming a first conductive material layer over the bottom surface and the sidewalls of the substrate within the openings, and over the substrate to connect the at least two openings;
   directionally depositing a second conductive material layer to form a nucleation layer over the first conductive material layer over the bottom surface of the openings;
   removing the second conductive material layer such that the nucleation layer remains solely over the bottom surface of the openings; and
   electroless plating a third conductive material layer comprising boron- or phosphorus-doped metal onto the nucleation layer to fill the openings, wherein the at least two openings are filled about simultaneously.

54. A method of fabricating conductive contacts in openings in a substrate, each opening defined by a bottom surface and sidewalls of the substrate, at least two of the openings extending to areas having different surface potentials wherein one of the openings extend to an electrically floating area, the method comprising the steps of:
   forming a first conductive material layer over the bottom surface and the sidewalls of the substrate within the openings, and over the substrate to connect the at least two openings;
   directionally depositing a second conductive material layer to form a nucleation layer over the first conductive material layer over the bottom surface of the openings;
   removing the second conductive material layer such that the nucleation layer remains solely over the bottom surface of the openings; and
   electroless plating a third conductive material layer comprising boron- or phosphorus-doped metal onto the nucleation layer to fill the openings, wherein the at least two openings are filled about simultaneously.

55. A method of fabricating conductive contacts in openings in a substrate, each opening defined by a bottom surface and sidewalls of the substrate, at least two of the openings extending to active areas in the substrate having different surface potentials, the method comprising the steps of:
   forming a first conductive material layer over the bottom surface and the sidewalls of the substrate within the openings and over the substrate to connect the at least two openings;
   directionally depositing a second conductive material layer to form a nucleation layer over the first conductive material layer over the bottom surface of the openings;
   removing the second conductive material layer such that the nucleation layer remains solely over the bottom surface of the openings; and
   electroless plating a third conductive material layer comprising boron- or phosphorus-doped metal onto the nucleation layer to fill the openings, wherein the at least two openings are filled about simultaneously.

56. A method of fabricating conductive contacts in openings in a substrate, each opening defined by a bottom surface and sidewalls of the substrate, at least two of the openings extending to active areas in the substrate having different surface potentials wherein one of said openings extends to an active area comprising a first conductivity enhancing dopant and another of said openings extends to an active area comprising a second conductivity enhancing dopant, the method comprising the steps of:

forming a first conductive material layer over the bottom surface and the sidewalls of the substrate within the openings, and over the substrate to connect the at least two openings;

directionally depositing a second conductive material layer to form a nucleation layer over the first conductive material layer over the bottom surface of the openings;

removing the second conductive material layer such that the nucleation layer remains solely over the bottom surface of the openings; and electroless plating a third conductive material layer onto the nucleation layer to fill the openings, wherein the at least two openings are filled about simultaneously.

57. A method of fabricating conductive contact in openings in a substrate, each opening defined by a bottom surface and sidewalls of the substrate, at least two of the openings extending to active areas in the substrate having different surface potentials wherein one of said openings extends to an active area comprising a P-type conductivity enhancing dopant and another of said openings extends to an active area comprising a N-type conductivity enhancing dopant, the method comprising the steps of:

forming a first conductive material layer over the bottom surface and the sidewalk of the substrate within the openings and over the substrate to connect the at least two openings;

directionally depositing a second conductive material layer to form a nucleation layer over the first conductive material layer over the bottom surface of the openings;

removing the second conductive material layer such that the nucleation layer remains solely over the bottom surface of the openings; and electroless plating a third conductive material layer onto the nucleation layer to fill the openings, wherein the at least two openings are filled about simultaneously.

58. A method of fabricating conductive contacts in openings in a substrate, each opening defined by a bottom surface and sidewalls of the substrate, at least two of the openings extending to first and second active areas in the substrate having different electrical charges, the first active area comprising a P-type conductivity enhancing dopant and the second active area comprising a N-type conductivity enhancing dopant, the method comprising the steps of:

forming a first conductive material layer over the bottom surface and the sidewalls of the substrate within the openings, and over the substrate to connect the at least two openings;

directionally depositing a second conductive material layer to form a nucleation layer over the first conductive material layer over the bottom surface of the openings;

removing the second conductive material layer such that the nucleation layer remains solely over the bottom surface of the openings; and electroless plating a third conductive material layer onto the nucleation layer to fill the openings, wherein the at least two openings are filled about simultaneously.

* * * * *

UNITED STATES PATENT AND TRADEMARK OFFICE
CERTIFICATE OF CORRECTION

| | |
|---|---|
| PATENT NO. | : 7,098,128 B2 |
| APPLICATION NO. | : 10/931822 |
| DATED | : August 29, 2006 |
| INVENTOR(S) | : Dale W. Collins and Rita J. Klein |

It is certified that error appears in the above-identified patent and that said Letters Patent is hereby corrected as shown below:

Column 4, line 4: Replace "dramatic" with --diagrammatic--.
Column 14, line 39: Replace "substrates" with --substrate,--.
Column 17, line 59: After "openings", delete "." and insert --; and--.
Column 21, line 34: Replace "sidewalk" with --sidewalls--.

Signed and Sealed this

Tenth Day of July, 2007

JON W. DUDAS
*Director of the United States Patent and Trademark Office*